United States Patent
Nezami

(10) Patent No.: US 7,113,037 B2
(45) Date of Patent: Sep. 26, 2006

(54) PERFORMING REMOTE POWER AMPLIFIER LINEARIZATION

(75) Inventor: Mohamed K. Nezami, South Pasadena, FL (US)

(73) Assignee: Raytheon Company, Waltham, MA (US)

(*) Notice: Subject to any disclaimer, the term of this patent is extended or adjusted under 35 U.S.C. 154(b) by 117 days.

(21) Appl. No.: 10/890,661

(22) Filed: Jul. 14, 2004

(65) Prior Publication Data

US 2006/0012426 A1 Jan. 19, 2006

(51) Int. Cl.
*H03F 1/26* (2006.01)

(52) U.S. Cl. .................. 330/149; 330/75; 375/296; 455/92

(58) Field of Classification Search ............. 330/149, 330/75; 375/296; 455/92
See application file for complete search history.

(56) References Cited

U.S. PATENT DOCUMENTS

| | | | | |
|---|---|---|---|---|
| 4,462,001 A | 7/1984 | Girard | | 330/149 |
| 4,701,717 A | 10/1987 | Radermacher et al. | | 330/149 |
| 5,872,814 A | 2/1999 | McMeekin | | 375/296 |
| 5,900,778 A | 5/1999 | Stonick et al. | | 330/149 |
| 5,923,714 A | 7/1999 | Hwang | | 375/347 |
| 5,937,011 A * | 8/1999 | Carney et al. | | 375/297 |
| 6,072,364 A | 6/2000 | Jeckeln et al. | | 330/149 |
| 6,141,390 A * | 10/2000 | Cova | | 375/297 |
| 6,205,170 B1 | 3/2001 | De Santos et al. | | 375/219 |
| 6,285,859 B1 | 9/2001 | Durán et al. | | 455/63 |
| 6,314,142 B1 * | 11/2001 | Perthold et al. | | 375/296 |
| 6,351,677 B1 * | 2/2002 | Leyonhjelm et al. | | 700/44 |
| 6,400,775 B1 | 6/2002 | Gourgue et al. | | 375/296 |
| 6,459,334 B1 | 10/2002 | Wright et al. | | 330/2 |
| 6,498,529 B1 | 12/2002 | Kim et al. | | 330/2 |
| 6,504,425 B1 | 1/2003 | Kim | | 330/2 |
| 6,614,854 B1 | 9/2003 | Chow et al. | | 375/297 |
| 6,931,080 B1 * | 8/2005 | Giardina et al. | | 375/296 |

FOREIGN PATENT DOCUMENTS

WO WO 01/05026 A1 1/2001
WO WO 03/043182 A1 5/2003

OTHER PUBLICATIONS

Bösch, Wolfgang, et al., "Measurement and Simulation of Memory Effects in Predistortion Linearizers," IEEE Transactions on Microwave Theory and Techniques, vol. 37, No. 12, © 1989 IEEE, pp. 1885-1890, Dec. 1989.

Yao, L., et al., "Identification of a Nonlinear System Modeled by a Sparse Volterra Series," IEEE International Conference on Systems Engineering, Kobe, Japan, IEEE Catalog No.: 92CH3179-9, © 1992 IEEE, pp. 624-627 plus cover sheet, Sep. 17-19, 1992.

(Continued)

*Primary Examiner*—Patricia Nguyen
(74) *Attorney, Agent, or Firm*—Baker Botts L.L.P.

(57) ABSTRACT

Estimating non-linearity of a power amplifier includes receiving signals at a first location. The signals include an input signal, a pre-distorted signal, and an output signal. The output signal exhibits distortion, including a non-linearity effect, with respect to the input signal. The power amplifier is located at a second location remote from the first location. The non-linearity of the power amplifier is estimated in accordance with the signals at the first location using an inverse model. Pre-distortion information is calculated according to the estimated non-linearity using the inverse model. The pre-distortion information is sent to a pre-distorter at the second location, where the pre-distorter can reduce the non-linearity effect using the pre-distortion information.

20 Claims, 3 Drawing Sheets

OTHER PUBLICATIONS

Kenney, J.S., et al., "The Impact of Memory Effects on Predistotion Linearization of RF Power Amplifiers," ISMOT-2001, Proc. 8th Int. Microwave Opt. Technol. Symp., Montreal, Canada, pp. 189-193 plus cover sheet, Jun. 19-23, 2001.

Vuolevi, Joel H.K., et al., "Measurement Technique for Characterizing Memory Effects in RF Power Amplifiers," IEEE Transactions on Microwave Theory and Techniques. vol. 49, No. 8, pp. 1383-1389, Aug. 2001.

McBeath, S.M., "W-CDMA Power Amplifier Modeling," IEEE 54th Vehicular Technology Conference, VTC Fall 2001 Proceedings, vol. 4—Poster Sessioins, Atlantic City, New Jersey, © 2001 IEEE, pp. 2243-2247 pplus cover sheet, Fall 2001.

Ku, Hyunchul, et al., "Quantifying Memory Effects in RF Power Amplifiers," IEEE Transactions on Microwave Theory and Techniques. vol. 50, No. 12, pp. 2843-2849, Dec. 2002.

Nizamuddin, Muhammad A., "Nonlinear Tapped Delay Line Digital Predistorter for Power Amplifiers with Memory," 2003 IEEE Wireless Communications and Networking Conference Record, New Orleans, Louisiana, © 2003 IEEE, pp. 607-611 plus cover sheet, Mar. 16-20, 2003.

Ding, L., et al., "A Robust Digital Baseband Predistorter Constructed Using Memory Polynomials," IEEE Transactions on Communications, vol. 52, No. 1, pp. 159-165, Jan. 2004.

Patent Application filed Jul. 14, 2004, by inventor Mohamed K. Nezami, entitled "Estimating Power Amplifier Non-Linearity In Accordance With Memory Depth," 43 total pages, Jul. 14, 2004.

Changsoo Eun, et al., "*A Predistorter Design for a Memory-less Nonlinearity Preceded by a Dynamic Linear System*", ISBN: 0-7803-2509-5, © 1995 IEEE, pp. 152-156.

Hyun Woo Kang, et al., "*An Efficient Adaptive Predistorter for Nonlinear High Power Amplifier in Satellite Communication*," 1997 IEEE International Symposium on Circuits and Systems, ISBN: 0-7803-3583-X, pp. 2288-2291, Jun. 9-12, 1997.

PCT, Notification of Transmittal of the International Search Report and The Written Opinion of the International Searching Authority, or the Declaration, dated Oct. 10, 2005 for International Application No. PCT/US2005/024230, 10 pages, Oct. 10, 2005.

PCT, Notification of Transmittal of the International Search Report and The Written Opinion of the International Searching Authority, or the Declaration, dated Oct. 14, 2005 for International Application No. PCT/US2005/024234, 13 pages, Oct. 14, 2005.

\* cited by examiner

PERFORMING REMOTE POWER AMPLIFIER LINEARIZATION

TECHNICAL FIELD

This invention relates generally to the field of power amplifiers and more specifically to performing remote power amplifier linearization.

BACKGROUND

Power amplifiers are typically a major source of non-linearity in communication systems. Tactical satellite transmission systems may be particularly sensitive to non-linearity because of their inherently high peak-to-average power ratios (PAPR). To reduce the effects of non-linearity, the non-linearity of a power amplifier can be estimated, and a signal can be pre-distorted in accordance to the estimate to compensate for the non-linearity. Known techniques, however, may not sufficiently reduce the effects of non-linearity in certain situations. It is generally desirable to sufficiently reduce the effects of non-linearity.

SUMMARY OF THE DISCLOSURE

According to one embodiment of the present invention, estimating non-linearity of a power amplifier includes receiving signals at a first location. The signals include an input signal, a pre-distorted signal, and an output signal. The output signal exhibits distortion, including a non-linearity effect, with respect to the input signal. The power amplifier is located at a second location remote from the first location. The non-linearity of the power amplifier is estimated in accordance with the signals at the first location using an inverse model. Pre-distortion information is calculated according to the estimated non-linearity using the inverse model. The pre-distortion information is sent to a pre-distorter at the second location, where the pre-distorter can reduce the non-linearity effect using the pre-distortion information.

Certain embodiments of the invention may provide one or more technical advantages. A technical advantage of one embodiment may be that off-line components for determining non-linearity of on-line components may be located remote from the on-line components. Locating the off-line components remote from the on-line components may allow for remote linearization of the on-line components while reducing power and space requirements for the on-line components.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
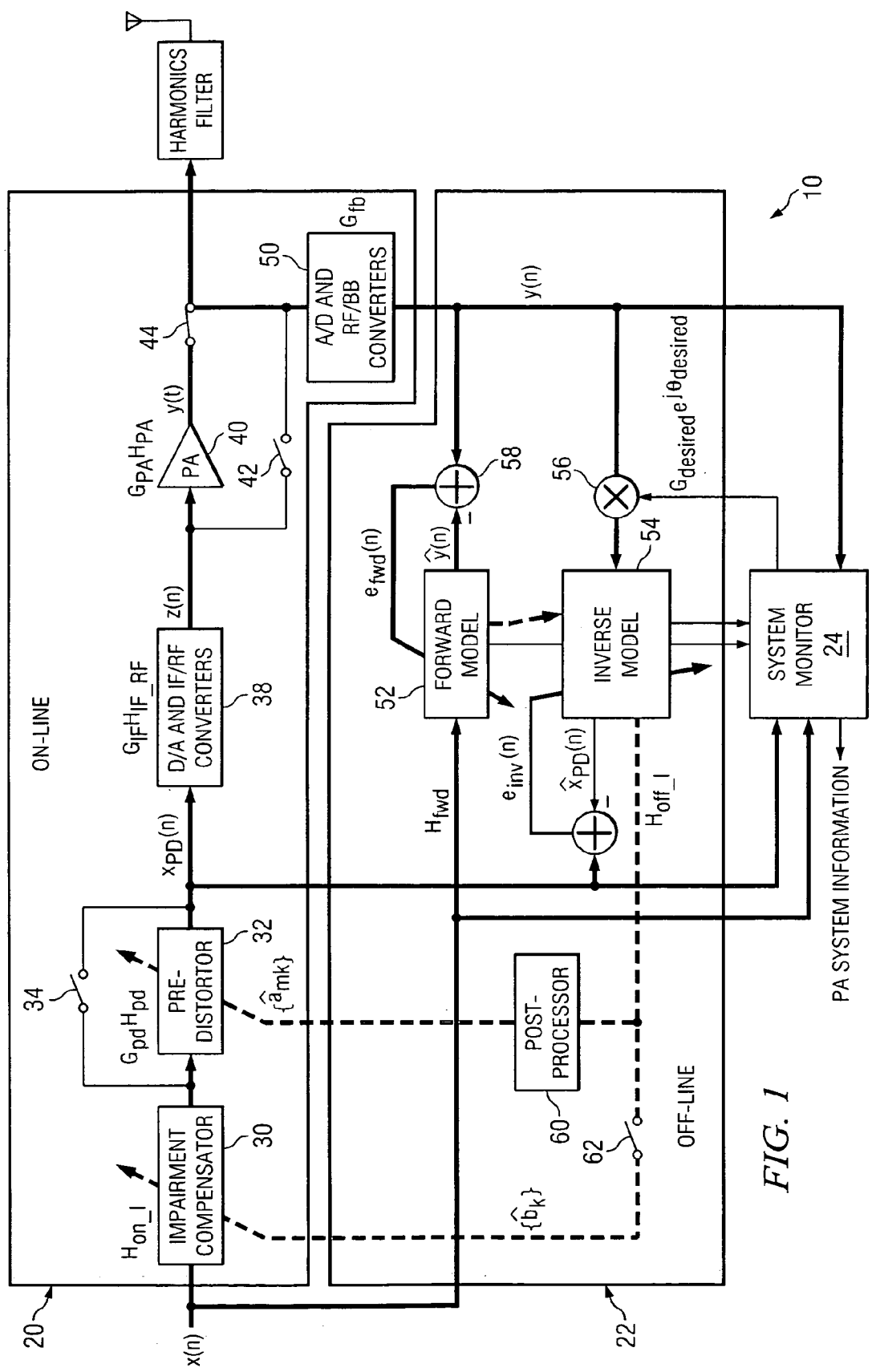
FIG. 1 is a block diagram of one embodiment of a system for linearizing a power amplifier.
Figure 2:
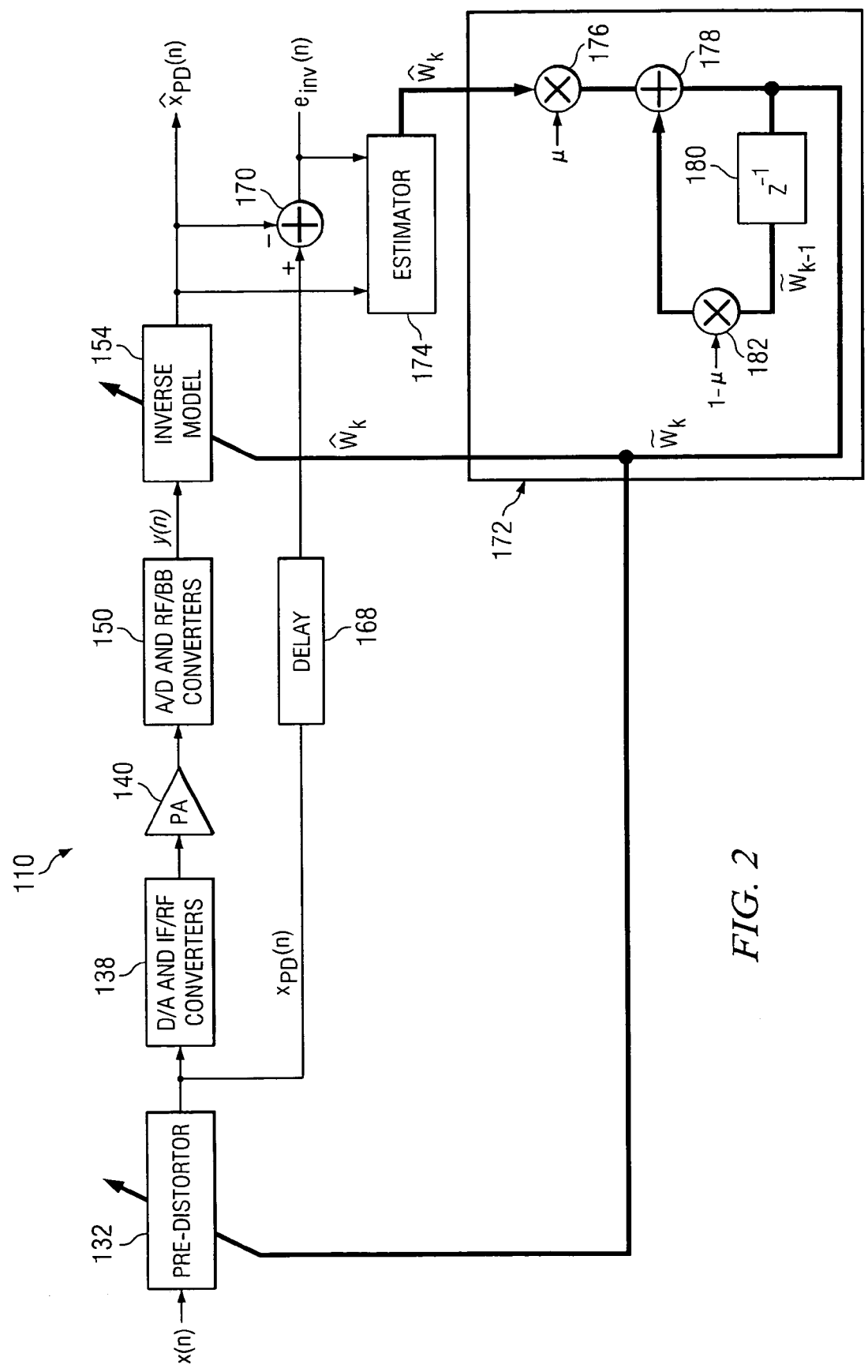
FIG. 2 is a block diagram of one embodiment of a system that includes a filter smoother that performs a smoothing operation on pre-distorter weights before feeding the weights to an on-line pre-distorter.
Figure 3:
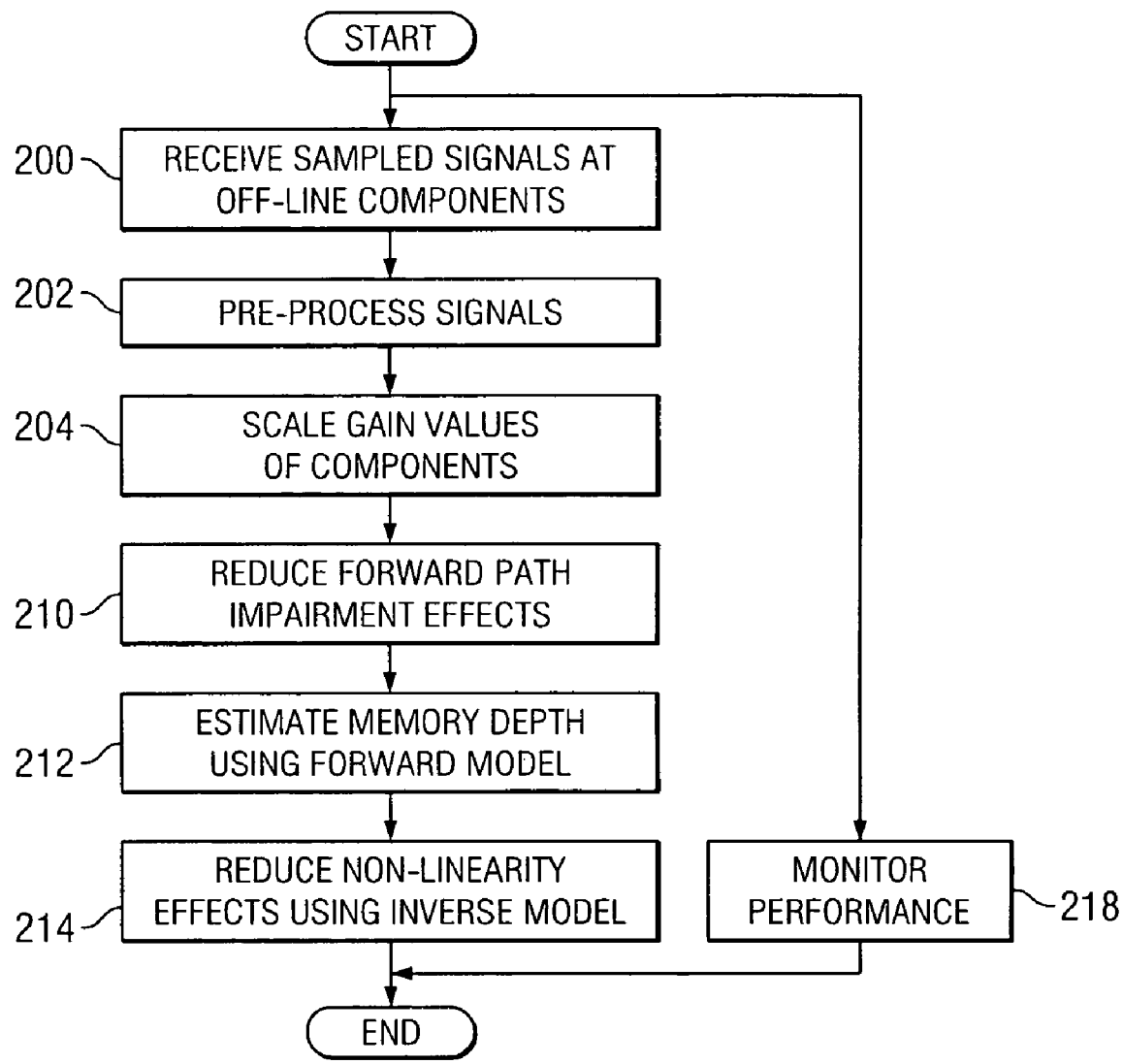
FIG. 3 is a flowchart illustrating one example of a method for estimating the non-linearity and memory depth of a power amplifier that may be used with the system of FIG. 1.

Embodiments of the present invention and its advantages are best understood by referring to FIGS. 1 through 3 of the drawings, like numerals being used for like and corresponding parts of the various drawings.

FIG. 1 is a block diagram of one embodiment of a system 10 for linearizing a power amplifier. System 10 estimates the memory depth and non-linearity of a power amplifier from forward and inverse transfer functions, respectively. System 10 calculates one or more pre-distortions from the estimates, and then applies the pre-distortions to compensate for the non-linearity in accordance with the memory depth.

According to the illustrated embodiment, system 10 includes one or more on-line components 20, one or more off-line components 22, and a system monitor 24 coupled as shown. On-line components 20 perform on-line processing. On-line processing may refer to signal processing that may be performed in real time at approximately the same physical location where the signal originates. On-line components 20 include components that amplify an input signal x(n) to yield an output signal y(t), while reducing or removing distortions of the output signal y(t). Off-line components 22 perform off-line processing. Off-line processing may refer to signal processing that may be performed in non-real time and not necessarily at the same physical location where the signal originated. Off-line components 22 include components that are used to determine information used to reduce or remove the distortions of the output signal y(t). System monitor 24 sends and receives information to a user interface to allow for controlling and monitoring of system 10.

On-line components 20, off-line components 22, and system monitor 24, may be located at one location or may be located at different locations. According to one embodiment, on-line components 20 and off-line components 22 are located in the same device. According to another embodiment, on-line components 20 are located at a first location, while off-line components 22 and system monitor 24 are located at a second location distant from the first location. The first location may be any suitable distance from the second location, for example, more than one inch, more than one yard, or more than one, ten, one hundred, or one million miles away from the second location.

The first location may refer to a site where signal amplification is needed, but which might not be easily accessed to monitor or control the signal amplification or which might not have sufficient resources such as power or space to monitor or control the signal amplification. Examples of the first location include a spacecraft such as a satellite or a space probe or a geographically remote place such as a cellular base station. The second location may refer to a site that may be easily accessed or may have sufficient resources to monitor or control power amplification. Examples of the second location include a space command station or a central office. On-line components 20 and off-line components 22 may communicate signals to each other using any suitable combination of transmitters and receivers. According to one embodiment, off-line components 22 may also be used to test power amplifiers in a manufacturing facility. The power amplifiers may be at one location of the facility, while the off-line components 22 may be at another location.

On-line components 20 receive input signal x(n), pre-distort input signal x(n) to yield pre-distorted signal $x_{PD}(n)$.

Input signal describes a pre-amplified signal, which may be filtered, converted, or otherwise processed before reaching the power amplifier. Output signal describes a signal that has been amplified by the distorting power amplifier.

According to the illustrated embodiment, on-line components 20 include an impairment compensator 30, a pre-distorter 32, a switch 34, a digital-to-analog (D/A) converter and an intermediate frequency-to-radio frequency (IF/RF) converter 38, a power amplifier (PA) 40, a switch 42, and a high power signal coupler 44 coupled as shown. In general, features of power amplifier 40 such as non-linearity and memory depth may distort a signal. In order to reduce or remove the distortion, pre-distorter 32 may be used to introduce a pre-distortion into the signal to compensate for the distortion.

Impairment compensator 30 operates on input signal x(n) to compensate for impairments. An impairment may refer to any feature of components, other than power amplifier 40, that distorts a signal. An impairment effect may refer to any type of distortion such as a non-uniform delay or a gain or phase variation resulting from an impairment. For example, D/A converter 38 yields an amplitude roll-off factor. Impairment compensator 30 may receive compensation information for compensating for impairment from off-line components 22 while power amplifier 40 is not amplifying. The off-line obtained compensation information may include compensator coefficients, or weights, that may be used to adjust the operating parameters of impairment compensator 30 to compensate for impairments. According to another embodiment, impairment compensator 30 and pre-distorter 32 may be combined into one module, yet configured independently to correct for non-linearity and impairments.

Pre-distorter 32 modulates input signal x(n) to introduce pre-distortions into the signal to compensate for the non-linearity of power amplifier 40. Non-linearity may describe a feature of power amplifier 40 that distorts a signal. A non-linearity effect may describe any type of distortion resulting from a non-linearity. Pre-distorter 32 may receive pre-distortion information for compensating for non-linearity from off-line components 22. Pre-distortion information may include pre-distorter coefficients, or weights, that may be used to adjust the operating parameters of pre-distorter 32. Typically, the operation of a pre-distorter may be described by a set of power amplifier inverse polynomials, where each polynomial applies to a tap of the pre-distorter that is implemented during a tape-delay line filter. The coefficients of the polynomials may be used to control the operating parameters of the pre-distorter.

The operating parameters may be adjusted such that pre-distorter 32 has the inverse characteristics of power amplifier 40 to compensate for the non-linearity of power amplifier 40. The design of pre-distorter 32 may be regarded as a copy of the design of a power amplifier transfer function obtained by an inverse model module 54 of offline components 22, except that operating parameters may be used to make pre-distorter 32 a complement, or inverse, of power amplifier 40. Switch 34 may be used to bypass pre-distorter 32 during initial assessments or during the estimation of the forward path impairments using a forward model module 52 of offline components 22.

According to one embodiment, prior to processing by converters 38, pre-distorted signal $x_{PD}(n)$ may be fed to an interpolator to increase the sampling rate and reduce desired spectrum separation. Interpolated pre-distorted signal $x_{PD}(n)$ may be up-converted to a digital intermediate frequency using a digital up-converter (DUC). According to one example, pre-distorted signal $x_{PD}(n)$ may be over-sampled to a rate that is exactly one-fourth of the frequency of the desired intermediate frequency (IF) signal in order to perform digital up-conversion without use of a dedicated numerically controlled oscillator (NCO) and real time multiplication.

D/A converter 38 converts pre-distorted signal $x_{PD}(n)$, up-converted from baseband to IF, from a digital format to an analog format. IF/RF converter 38 converts pre-distorted signal $x_{PD}(n)$ from an intermediate frequency to a radio frequency. Converters 38 may also apply a gain $G_{IF}$ to pre-distorted signal $x_{PD}(n)$.

Power amplifier 40 applies a power amplifier gain $G_{PA}$ to pre-distorted signal $x_{PD}(n)$, and may apply distortions to the pre-distorted signal resulting from features such as non-linearity. Coupler 44 splits output signal y(n) into an output signal and a feedback signal. Switch 42 is used to bypass power amplifier 40 to determine impairments introduced by other components of components 20, such as those caused by converters 38.

Off-line components 22 determine adjustments of on-line components 20 that may be made to reduce distortion of output signal y(n). Off-line components 22 include an analog-to-digital (A/D) converter and a radio frequency-to-baseband (RF/BB) converter 50, a forward model module 52, an inverse model module 54, a multiplier 56, a summer 58, a post-processor 60, and a switch 62 coupled as shown. According to one embodiment, off-line components 22 may be implemented as non-linear tape-delay-line (NTDL) complex filters known in the art.

According to the embodiment, off-line components 22 receive input signal x(n), pre-distorted signal $x_{PD}(n)$, and output signal y(t) from on-line components 20. A/D converter 50 converts the feedback signal y(t) from an analog format. RF/BB converter 50 converts signal y(n) from IF or RF to baseband centered at, for example, zero Hz, using digital signal processing. Converters 50 may also apply a feedback gain $G_{fb}$.

According to one embodiment, the feedback signal y(t) comprises an ultrahigh frequency (UHF) carrier with a bandwidth equal to approximately five to seven times the bandwidth of baseband signal x(n). For example, if the baseband signal x(n) has a bandwidth of ±15 MHz, the bandwidth of the feedback signal is ±75 MHz to ±105 MHz, which covers the inter-modulations created up to the fifth and seventh order non-linearity inter-modulation products. Feedback signal y(t) may be sampled directly at an ultrahigh frequency without sampling an intermediate frequency. For example, an ultrahigh frequency signal centered at 255 MHz may be sampled at a rate of 150 MHz to yield a digital intermediate frequency signal of 45 MHz. The signal may be converted to baseband so modules 52 and 54 may operate on the signal. According to another embodiment, the pre-distortions may be applied to the IF signal, and not the baseband signal x(n). The feedback signal y(n) is translated to the same frequency as the pre-distorter IF frequency.

Off-line components 22 may use blocks of samples of the on-line signals, so off-line components 22 may be operated at a rate different from that of on-line components 20. For example, converters 50 may sample at a rate of 150 MHz to capture 1024 samples, and then translate the samples to baseband according to Equation (1):

$$y(n) \leftarrow y(n) e^{-j\frac{2\pi 45 \times 10^6 (n=0:1023)}{150 \times 10^6}} \quad (1)$$

where n is the sample index. Before passing the signal to the model modules 52 and 54, the samples may be filtered to reduce or remove DC offset, local oscillator leakage, radio frequency image, other feature, or any combination of the preceding.

Using the captured samples y(n), forward model module 52 and inverse model module 54 generate forward and inverse models, respectively, of power amplifier 40. According to one embodiment, if pre-distorter 32 is bypassed, the current output signal y(n) may be modeled as the summation of a number of non-linear polynomials operating on the current sample as well as past samples that mimic the temporal storage of energy due to PA memory depth, which may be given by Equation (2):

$$\hat{y}(n) = \sum_{m=0}^{m=M} x(n-m) \sum_{k=1}^{k=P} b_{mk} |x(n-m)|^{k-1} \qquad (2)$$

where $b_{mk}$ are complex coefficients that model the PA non-linear dynamics, x(n) is the baseband input of power amplifier 40, n is the sample index, m is the sample delay representing the memory index, and M is the maximum value of delays that represent the memory depth. For pre-distorter 32 to effectively pre-distort a signal, typically M is needed. Forward model module 52 estimates memory depth M, which inverse model module 54 uses to estimate coefficients for pre-distorter 32.

Forward model module 52 applies a forward transfer function of a forward model to signals x(n) and ŷ(n) to estimate the memory depth M of power amplifier 40 and to generate information for system monitor 24. A forward model represents the forward dynamics of power amplifier 40 as described by a forward transfer function that estimates the equivalent baseband linear and non-linear response using Equation (2). The memory depth M describes the number delay taps that may be used to model power amplifier 40.

Inverse model module 54 applies an inverse transfer function of an inverse model to signals $x_{PD}$(n) and y(n) to determine pre-distortion information such as pre-distorter weights that pre-distorter 32 may use to pre-distort the signal. An inverse model represents the inverse transfer function of power amplifier 40 as described by an inverse transfer function. The function may be programmed into pre-distorter 32 to be provided in series to power amplifier 40 to reduce the non-linearity of power amplifier 40. According to one embodiment, the pre-distortion information may be generated in accordance with memory information provided by module 52 in order to account for the memory depth of power amplifier 40. Inverse model module 54 may also generate compensation information to compensate for impairments introduced by the components of system 10 using the inputs x(n) and $x_{PD}$(n).

Inverse model module 54 reduces or removes the PA forward phase shift, so the complex multiplier 56 may be used to multiply feedback signal y(n) by a desired complex gain $G_{desired}e^{j\theta_{desired}}$, which introduces a desired phase $\theta_{desired}$ and gain scaling $G_{desired}$ into pre-distorter 32, and j is complex notation corresponding to $\sqrt{-1}$. The feedback signal y(n) may be multiplied by the complex gain y(n)←y(n) $G_{desired}e^{j\theta_{desired}}$ in order to adjust the total overall forward gain and phase of power amplifier 40, discussed below in more detail. Post-processor 60 may be used to perform post-processing on the pre-distortion information such as pre-distorter weights. Post-processing may make system 10 more robust against sudden input signal variations or any other unexpected changes in the output signal y(n).

System monitor 24 communicates information to, from, or both to and from a user interface to allow for controlling and monitoring of system 10 by a user. Information provided to a user interface may include the amplitude-to-amplitude (AM/AM) and amplitude-to-phase (AM/PM) distortion of the signals, the temporal alignment of the PA input and output baseband signals, the correlation function indicating the alignment of the baseband signals, other information, or any combination of the preceding. Information received from a user interface may include setting for an operating power level, a desired power amplifier gain, or a total power amplifier phase shift, other information, or any combination of the preceding. According to one embodiment, system monitor 24 may be used to control the gain and phase of power amplifier 40 as discussed below.

Modifications, additions, or omissions may be made to system 10 without departing from the scope of the invention. For example, post-processor 60 may be omitted. Moreover, fewer, or other modules may perform the operations of system 10. For example, the operations of system monitor 24 may be performed by more than one module. Additionally, operations of system 10 may be performed using any suitable logic comprising software, hardware, other logic, or any suitable combination of the preceding. As used in this document, "each" refers to each member of a set or each member of a subset of a set.

FIG. 2 is a block diagram of one embodiment of a system 110 that includes a filter smoother 172 that performs a smoothing operation on pre-distorter weights before feeding the weights to an on-line pre-distorter 132. According to one embodiment, system 110 includes pre-distorter 132, a digital-to-analog (D/A) converter and an intermediate frequency-to radio frequency (I/F-R/F) converter 138, a power amplifier 140, an analog-to-digital (A/D) converter and a radio frequency-to-baseband frequency (RF/BB) converter 150, an inverse model module 154, a summer 170, and a filter smoother 172 coupled as shown. According to the illustrated embodiment, pre-distorter 132, converters 138, power amplifier 140, and converters 150 may operate in a manner substantially similar to pre-distorter 32, converters 38, power amplifier 40, and converters 50 respectively of system 10 of FIG. 1.

The post-processing module comprising filter smoother 172 may be implemented as a first order filter smoother that performs a first order recursive operation. Filter smoother 172 performs a smoothing operation on pre-distorter weights obtained by off-line estimator 174 before feeding the weights to pre-distorter 132. Filter smoother 172 includes, a multiplier 176, a summer 178, a delay 180, and a multiplier 182 coupled as shown. The post-processing module may alternatively comprise a moving average filter, a Savitsky-Golay smoothing filter, or other suitable filter.

As an example, samples sets of signals $x_{PD}$(n) and $\hat{x}_{PD}$(n) are processed. A sample set of a signal may include any suitable number of samples from the signal, for example, 1024 samples. According to the illustrated embodiment, delay 168 delays signal $x_{PD}$(n) such that signal $\hat{x}_{PD}$(n) arrives at summer 170 at substantially the same time as the corresponding signal $x_{PD}$(n) of the same sample. Summer 170 determines the difference between signals x(n) and $\hat{x}$(n) to generate error signal $e_{inv}(n)=x_{PD}(n)-\hat{x}_{PD}(n)$. Error signal $e_{inv}$(n) and delayed samples of $x_{PD}$(n) are passed to estimator 174, which adjusts the weights of off-line processor 154 in order to minimize the next error signal $e_{inv}$(n+1).

Estimator 174 determines if error signal $e_{inv}(n)$ satisfies an error threshold, indicating that the weights are acceptable. Error signal $e_{inv}(n)$ may be measured using the normalized mean square error (NMSE), which is the logarithmic norm power that may be given by Equation (3):

$$NMSE = 10 \log_{10} \frac{\sum_n |x_{PD}(n) - \hat{x}_{PD}(n)|^2}{\sum_n |x_{PD}(n)|^2} \quad (3)$$

In this example, error signal $e_{inv}(n)$ satisfies the error threshold if the NMSE is less than −40 dB. If error signal $e_{inv}(n)$ satisfies the error threshold, estimator 174 sends weights $\hat{w}_k$ of inverse model module 154 to complex multiplier 176, where bold text represents a vector or matrix. According to one example, estimator 174 may send only selected weights to multiplier 176. For example, the weights corresponding to the n=974 sample of a set of 1024 samples of $x_{PD}(n)$ may be selected as the kth optimal weights. The weights corresponding to samples after n=1024 and before n=974 may be discarded to protect against end transients. The weights at n−974 may be validated and checked to make sure they do not exceed the allowable range of pre-distorter 32.

Multiplier 176 multiplies weights $\hat{w}_k$ by $\mu$, where k is the index of the weight updates and $\mu$ represents a smoothing factor, $0 \leq \mu \leq 1$. The post-processing smoothing factor represents the desired degree of smoothing. Delay 180 delays the output from multiplier 178, and multiplier 182 multiplies the output by $1-\mu$. Summer 178 adds the output from multipliers 176 and 178 to yield smoothed weights $\tilde{w}_k$. In this embodiment, an "iteration" may refer to a cycle where a sample or weight is processed and passed on to on-line pre-distorter 132.

The smoothing operation may be described by Equation (4):

$$\tilde{w}_k = \begin{cases} \hat{w}_k, & k < L \\ \mu \hat{w}_k + (1-\mu)\tilde{w}_{k-1}, & k > L \end{cases} \quad (4)$$

where k represents the iteration index, L represents the iteration at which smoothing begins that is supplied by system monitor 24 of FIG. 1, and $\hat{w}_k$ represents the set of selected weights after k iterations from inverse model 174.

The robustness of this scheme is evident from the variance and noise reduction of coefficients $\tilde{w}_k$ compared to that of $\hat{w}_k$. The variance and noise reduction due to the smoothing operation is given by $$\frac{\mu}{2-\mu}.$$

The smoothing operation however, may result in a slow adaptation response to reach the steady state values for the optimal weights. For example, if $\mu=0.4$, the steady state is reached after ten iterations, and the noise and variance reduction is 12 dB. If $\mu=0.2$, the steady state is reached after twenty iterations, and the noise and variance reduction is 19 dB. The value of L in Equation (3) may be selected such that the smoothing operation does not start until system 10 is into good convergence areas, which may be at L=5 to L=10 iterations.

Modifications, additions, or omissions may be made to system 110 without departing from the scope of the invention. Moreover, the operations of system 110 may be performed by more, fewer, or other modules. Additionally, operations of system 110 may be performed using any suitable logic comprising software, hardware, other logic, or any suitable combination of the preceding.

FIG. 3 is a flowchart illustrating one example of a method for estimating the non-linearity of a power amplifier that may be used with system 10 of FIG. 1. In the example method, system 10 pre-processes signals and scales the gain of the components of system 10. System 10 estimates and compensates for the impairments of system 10, and then estimates and compensates for the non-linearity of power amplifier 40 in accordance with the memory depth of power amplifier 40.

Steps 200 and 202: Initial Steps

The method begins at step 200, where sampled signals are received at off-line components 22. The strips of sampled signals include input signal x(n), pre-distorted signal $x_{PD}(n)$, and output signal y(n). Pre-processing procedures are performed on the sampled signals at step 202. According to one embodiment, off-line components 22 may down-convert signals y(n) from an intermediate frequency to a baseband frequency, and may filter signals y(n) to reduce or remove the effects of DC offsets, local oscillator leakage, harmonics problems, spectral images, other problem, or any combination of the preceding. The time lag offset between the input sampled signal x(n) and the output sampled signal y(n) may also be reduced or removed.

Step 204: Scaling Forward Path Gain

The gain values for the components of system 10 are scaled at step 204. The scaling may be performed off-line and even remotely from a distance using the information supplied by system monitor 24 and samples x(n) and $x_{PD}(n)$. The components include power amplifier 40, D/A and IF/RF converter 38, and A/D and RF/BB converter 50. The pre-distorted output baseband samples may be given by Equation (5):

$$x_{PD}(n) = x(n)a_{01} + \sum_{k=2}^{k=P} a_{0k}|x(n)|^{k-1} + \quad (5)$$

$$x(n-1)a_{11} + \sum_{k=2}^{k=P} a_{1k}|x(n-1)|^{k-1} + x(n-2)a_{21} +$$

$$\sum_{k=2}^{k=P} a_{2k}|x(n-2)|^{k-1} + \ldots \sum_{m=0}^{m=M} x(n-m) \sum_{k=1}^{k=P} a_{mk}|x(n-m)|^{k-1}$$

where $a_{mk}$ represent pre-distorter weights, M represents memory depth, and P represents the polynomial order of the pre-distorter polynomial. Pre-distorter weights $a_{mk}$ make the pre-distorter transfer function substantially equivalent to the inverse transfer function of power amplifier 40. Off-line estimator 54 may be used to determine the weights. Off-line amplifier 40 forward model estimator 52 may supply estimates of memory depth M and polynomial order P. As an example, if M=2, the linear terms of the first three taps may be given by Equation (6):

$$x_{PD}(n) = x(n)\hat{a}_{01} + x(n-1)\hat{a}_{11} + x(n-2)\hat{a}_{21} \quad (6)$$

where $\hat{a}_{01}$, $\hat{a}_{11}$, and $\hat{a}_{21}$ are the estimates of the first three linear tap terms obtained from the off-line inverse model that estimates the required actual coefficients $a_{01}$, $a_{11}$, and $a_{21}$.

During initiation of the off-line estimation, the forward path gain may be set to provide the overall gain for the PA drive to reach a desired output peak power. The gain may be set by using $$\frac{x_{PD}(n)}{x(n)} = a_{01},$$

where the other coefficients are set to zero.

The total forward path gain may be given by Equation (7):

$$\frac{y(n)}{x(n)} = |a_{01}|G_{IF}G_{PA} \quad (7)$$

Initially, assuming that the input samples are $|x(n)| \leq 1$, pre-distorter weights $a_{mk}$, except linear term $a_{01}$, may be set to zero. Pre-distorted signal $x_{PD}(n)$ may then be given by Equation (8):

$$x_{PD}(n) = x(n)a_{01} \quad (8)$$

The power amplifier output peak power $P_{out}$(dBm) may then be given by Equation (9):

$$P_{out} \text{ (dbm)} = 10\log_{10}\left(\frac{1}{N}\sum_{1}^{N}|x(n)|^2\right) + PAPR + G_{fwd\_tot} \text{ [dBm]} \quad (9)$$

where N represents a statistically sufficient number of samples in a sample set, PAPR represents the peak-to-average power ratio of the baseband signal in dB, and $G_{fwd\_tot}$ represents the total forward path gain.

The total forward path gain may take into account gain from components such as converters 38, digital up-converter, and power amplifier 40, where the gain of the impairment compensator 30 is assumed to be one or zero dB, and small signal gain. The ratio PAPR may be given by Equation (10):

$$PAPR = \frac{\max(|x(n)|^2)}{\frac{1}{N}\sum_{1}^{N}|x(n)|^2} \text{ [dB]} \quad (10)$$

and the total forward path gain $G_{fwd\_tot}$ may be given by Equation (11):

$$G_{fwd\_tot} = (|a_{01}| + G_{IF} + G_{PA})[\text{dB}] \quad (11)$$

where $G_{IF}$ represents the combined digital up-converter gain, D/A converter sensitivity gain, and IF/RF converter gain, and $G_{PA}$ represents the gain of power amplifier 40.

The magnitude of the initial setting for the pre-distorter linear term $a_{01}$ may be chosen to achieve a desired power amplifier output peak power $P_{out}$ and may be given by Equation (12):

$$|a_{01}| = P_{out}(\text{dbm}) - G_{IF} - G_{PA}[\text{dB}] \quad (12)$$

Pre-distorter linear term $|a_{01}|$ may be converted from a power dB setting to a voltage dB setting to yield actual linear gain $$G_{PD} = 10^{\left(\frac{|a_{01}|}{20}\right)}$$

that may be programmed into a field programmable gate array (FPGA) implementation of pre-distorter 32.

When the off-line inverse model converges, the gain of pre-distorter 32 is not defined by the linear term of just the first tap, but may be given by $$\left|\sum_{m=0}^{m=M}\sum_{k=1}^{k=P}a_{mk}\right|.$$

For example, if the off-line forward path estimate yields memory depth M=3 and polynomial order P=3, the forward gain due to the pre-distorter is readjusted from $$\frac{x_{PD}(n)}{x(n)} = a_{01}$$

to Equations (13):

$$\begin{aligned}\frac{x_{PD}(n)}{x(n)} &= \left|\sum_{m=0}^{m=2}\sum_{k=1}^{k=3}a_{mk}\right| \\ &= \left|\sum_{k=1}^{k=3}a_{0k} + \sum_{k=1}^{k=3}a_{1k} + \sum_{k=1}^{k=3}a_{2k} + \right| \\ &= |\underbrace{(a_{01}+a_{02}+a_{03})}_{tap-1} + \underbrace{(a_{11}+a_{12}+a_{13})}_{tap-2} + \underbrace{(a_{21}+a_{22}+a_{23})}_{tap-3}|\end{aligned} \quad (13)$$

The closed loop system readjusts the pre-distorter gain to account for the gain incorporated into the additional taps that are used to mimic the memory response of power amplifier 40.

According to one embodiment, system monitor 24 may be used to change the gain and phase of power amplifier 40 by adjusting linear term $a_{01}$. If the phase of pre-distorter 32 is initially programmed to be zero degrees, where the gain is real, and if off-line components 22 introduce negligible phase shift, the estimated linear term $a_{01}$ has a phase shift that represents the total phase shift between the input and output of power amplifier 40. A calculated linear term $a_{01}$ may be used to apply a phase offset $\theta_{offset}$ to achieve a desired phase $\theta_{desired}$, which may be described by Equation (14):

$$\theta_{desired} = \arg\{\hat{a}_{01}\} = \arg\{a_{01}\} + \theta_{offset} \quad (14)$$

The gain and phase adjustment can be applied systematically as shown in FIG. 1 by incorporating a gain into the PA captured feedback signal given by $y(n) \leftarrow y(n)G_{desired}e^{j\theta_{desired}}$, which may be applied using multiplier 56 to change the gain and phase of power amplifier 40.

The drive level setting for D/A converter 38 may be calculated using a sample that has a unity maximum amplitude and is scaled by $a_{01}$. The sample is transmitted and the power setting calculated such that the output of D/A converter 38 is reduced by, for example, 6 dB from its full scale capabilities, and the output is reduced to account for the PAPR. For example, $$x_{PD}a_{01} = \frac{1}{2}(1+0j).$$

The resulting D/A gain $G_{DAC}$ may be estimated from the measured output peak power according to Equation (15):

$$G_{DAC} = P_{out,DAC} \text{ (dBm)} - 10\log_{10}\left(\left|\frac{1}{2}\right|^2\right) \text{ [dB]} \quad (15)$$

According to one embodiment, D/A converter 38 may be set with the worst loading case by considering the PAPR and the full-scale power handling (dB-FS). For example, if the setting of $$x_{PD}a_{01} = \frac{1}{2}(1+0j)$$

yielded −15 dBm, the digital-to-analog converter gain is $G_{DAC}$=−15 dB−(−6 dB)=−9 dB.

Scaling Feedback Path Gain

The feedback signal y(n) generated from output signal y(t) may be given by Equation (16):

$$y(n) = x(n)(G_{fwd\_tot}G_{ADC}G_{RF\_BB}) \quad (16)$$

where $G_{ADC}$ represents the analog-to-digital converter sensitivity gain, $G_{RF\_BB}$ represents the total RF feedback gain, which may include the gain from power amplifier output directional coupler attenuation, from any attenuator used to adjust the A/D input level, and from digital filtering and translation of the A/D output digital samples to baseband samples.

According to Equation (12), to compare output signal y(n) with pre-distorted signal $x_{PD}(n)$, the feedback path may be scaled by a feedback gain value that equates the signal $x_{PD}(n)$ from the output of pre-distorter 32 to the signal $\hat{x}_{PD}(n)$ at the output of inverse model module 54. The feedback gain may be written as $$g_{FB} = 10^{\left(\frac{-|G_{FB}|}{20}\right)},$$

where $g_{FB}$ may be given by Equation (17):

$$G_{FB} = G_{ADC} + G_{RF\_BB} + P_{out} \text{[dB]} \quad (17)$$

Step 210: Estimating and Reducing Impairment Effects

Impairment effects due to the forward path are reduced at step 210. Impairment effects may be reduced by estimating the impairments, while power amplifier 40 is bypassed by switch 42, using inverse model module 54 to yield a set of impairment compensation weights, and applying the impairment compensation weights to impairment compensator 30 to reduce impairment effects. Inverse model module 54 may estimate impairments by closing switch 42 to bypass power amplifier 40 and closing switch 34 if pre-distorter 32 has been programmed. The transfer function of the forward path is then equalized in order to isolate the impairments.

According to one embodiment, the forward path may be equalized by assuming that the undesired gain and phase variations in the forward path can be modeled using a finite impulse response (FIR) filter with N coefficients. Inverse model module 54 and impairment compensator 30 may be programmed to implement the FIR filter model. Module 54 in conjunction with minimum least-square error (MSE) reduction algorithm may be used to find the coefficients to load into impairment compensator 30.

The output of impairment compensator 30 may be given by Equation (18):

$$x_{PD}(n) = x(n) \quad (18)$$

Inverse model module 54 may be programmed with a filter to yield an output given by Equation (19):

$$\hat{x}_{PD}(n) = \sum_{k=0}^{N-1} b_k y(n-k) \quad (19)$$

where $b_k$ are the coefficients for inverse model module 54. The coefficients operate to reduce or cancel the gain and phase variations of the forward path $G_{IF}H_{IF\_RF}$ from converters 38 to yield linear gain $G_{IF}$. The coefficients $b_k$ for impairment compensator 30 are derived using inverse model module 54 in conjunction with MSE reduction algorithm described by Equation (20):

$$\min|e_{inv}|^2 = \min|x_{PD} - \hat{x}_{PD}|^2 \quad (20)$$

where $x_{PD}$ is written as $x_{PD}=(n)$.

The impairment of converters 38 may be reduced or removed as follows. The output of impairment FIR filter is initialized with a set of weights such that the $x_{PD}=x$. Impairment compensator 30 and inverse model module 54 are simultaneously programmed with a set of weights that reduces or cancels undesired gain and phase of converters 38, which may be designated using a linear gain and a frequency dependent transfer function given by $H_{IF\_RF}G_{IF}$. The impairment term $H_{IF\_RF}$ may be reduced or removed leaving the linear gain $G_{IF}$.

The output of impairment compensator 30 may be given by Equation (21):

$$x_{PD} = H_{on\_l}x \quad (21)$$

where $H_{on\_l}$ is the on-line transfer function. Pre-distorter 32 and power amplifier 40 are bypassed, so the digital baseband samples from converters 38 may be given by Equation (22):

$$y = z = H_{IF\_RF}G_{IF}x_{PD} \quad (22)$$

and the output of inverse model module 54 may be given by Equation (23):

$$\hat{x}_{PD} = H_{off\_l}y = H_{off\_l}H_{IF\_RF}G_{IF}x_{PD} \quad (23)$$

If there were no impairments from converters 38, the output of module 54 would be equal to the input of converters 38, that is, $\hat{x}_{PD}=x_{PD}$. The error function that can adapt the off-line transfer function to be an exact inverse of the impairment is given by Equation (24):

$$e_{inv}(n) = x_{PD} - \hat{x}_{PD} = \left[x_{PD}(n) - \sum_{k=0}^{N-1} b_k y(n-k)\right] = 0 \quad (24)$$

Substituting values for $\hat{x}_{PD}$, the error function is given by Equation (25):

$$e_{inv} = x_{PD} - H_{off\_1} H_{IF\_RF} G_{IF} x_{PD} = 0 \quad (25)$$

The error function reaches a minimum when the inverse model cancels the impairment from converters 38, which may be expressed by Equations (26):

$$H_{off\_1} H_{IF\_RF} G_{IF} = 1 \quad (26)$$

$$H_{off\_1} = \frac{1}{H_{IF\_RF} G_{IF}}$$

To reduce or cancel just the impairment but not the linear gain $G_{IF}$, the coefficients may be scaled to keep the linear gain according to Equation (27):

$$H_{on\_1} \leftarrow H_{on\_1} G_{IF} = \frac{1}{H_{IF\_RF}} \quad (27)$$

Now that the forward path has only linear gain $G_{IF}$, modules 52 and 54 are initiated again to estimate the PA electrical memory depth and non-linearity of power amplifier 40 without disturbances from impairments.

According to another embodiment, on-line impairment compensator 30 may be omitted. Impairment distortion such as group delay and gain variation, however, may prohibit optimal estimation and correction of the PA electrical memory and non-linearity. If the impairment inverse transfer function $H_{IF\_RF}^{-1}$ is cascaded in the off-line feedback path along with the inverse model function given by Equation (19), which effectively makes the off-line model transfer function ($H_{IF\_RF}^{-1} H_{off\_1}$), the error signal may be given by Equation (28):

$$e_{inv} = x_{PD} - \hat{x}_{PD} = 0 \quad (28)$$

The pre-distorted signal may be given by Equation (29):

$$\hat{x}_{PD} = x_{PD} G_{IF} H_{IF\_RF} G_{PA} H_{PA} G_{fb} (H_{IF\_RF}^{-1} H_{off\_1}) \quad (29)$$

Signal distortion is described by the PA non-linear function $H_{PA}$ and the forward path undesired frequency dependent function $H_{IF\_RF}$. Substituting the values for the pre-distorted signals into the error yields Equation (30):

$$e_{inv} = x_{PD} - x_{PD} G_{IF} H_{IF\_RF} G_{PA} H_{PA} G_{fb} (H_{IF\_RF}^{-1} H_{off\_1}) = 1 \quad (30)$$

Cascading the forward impairment function with the off-line inverse model yields $H_{IF\_RF} H_{IF\_RF}^{-1} = 1$, which simplifies the error signal to Equation (31):

$$G_{IF} H_{IF\_RF} G_{PA} H_{PA} G_{fb} (H_{IF\_RF}^{-1} H_{off\_1}) = 1 \quad (31)$$

where $G_{IF} G_{PA} H_{PA} G_{fb} H_{off\_1} = 1$.

The total feedback gain is set to be equal to the forward gain, that is, $$G_{fb} = \frac{1}{G_{IF} G_{PA}},$$

so the off-line model transfer function is given by Equation (32):

$$H_{off\_1} = \frac{1}{H_{PA}} \quad (32)$$

Accordingly, the off-line model is an inverse of power amplifier 40, and may be used to reduce or cancel PA non-linearity without any interference from the forward path transfer function $H_{IF\_RF}$.

Step 212: Estimating the PA Electrical Memory Depth and Its Forward Transfer Function The memory depth of power amplifier 40 is estimated at step 212 to generate memory information. The memory depth describes the number of delay taps that may be required to model power amplifier 40 to program pre-distorter 32 to reduce or cancel the PA non-linearities. A delay tap may refer to a single sample delay given by $$\tau = \frac{1}{F_s},$$

where $F_s$ is the complex signal sampling frequency of pre-distorter 32, that is, the time between two samples of $x_{PD}(n)$.

If the pre-distorter 32 is bypassed, that is, $x_{PD}(n) = x(n)$, the memory information describes the memory depth of power amplifier 40, and may include the memory constant of power amplifier 40 and the number of the delay taps for modeling power amplifier 40. The amplifier memory and non-linearity may be described by the PA output given by Equation (33):

$$y(n) = \sum_{m=0}^{m=M} x(n-m) \sum_{k=1}^{k=P} c_{mk} |x(n-m)|^{k-1} \quad (33)$$

where $c_{mk}$ are complex coefficients that describe the PA forward transfer function that includes memory and non-linearity, M is the memory depth, and P is the order of the polynomial that best fits the PA measurements, which describes the transfer function of AM/AM and AM/PM distortions.

Forward model module 52 may estimate the memory depth using a memory estimation procedure that involves two processes. First, forward model module 52 determines the order of an output signal polynomial corresponding to output signal y(n) that fits measured non-linearity distortion, such as measured AM/AM and AM/PM, for a memory-less system. The order may be, for example, a fifth or seventh order. The selected order may be based on the best value of P such that the PA observed samples y(n) and x(n) best fit Equation (34):

$$\hat{y}(n) - x(n) \sum_{k=1}^{k=P} c_k |x(n)|^{k-1} \qquad (34)$$

where $$\frac{\hat{y}(n)}{x(n)}$$

describes the AM/AM distortion, and $$\tan^{-1}\left(\frac{\hat{y}(n)}{x(n)}\right)$$

describes the AM/PM distortion.

Second, forward model module 52 performs a delay tap identification process using the established polynomial order to determine the memory depth. The number of delay taps M is first varied while the magnitude of the complex coefficients $|c_k|$ of the output signal polynomial is monitored with respect to a predetermined tap magnitude threshold. The number of delay taps required to model power amplifier 40, that is, the memory depth, is the delay value at which the tap magnitude, or signal power, decreases below a predetermined threshold.

The magnitude of the coefficients may be monitored in any suitable manner. According to one embodiment, the magnitude of coefficients of an output signal polynomial describing output signal y(t) for an impulse input signal x(t)=δ(t), where $$\delta(t - \tau) = \begin{cases} 1, & t = \tau \\ 0 & \text{else} \end{cases},$$

may be monitored. Using Equation (33), the memory activity signal y(t) may be described by Equation (35):

$$y(n) = \sum_{m=0}^{m=M} \sum_{k=1}^{k=P} a_{mk} \delta(n-m) |\delta(n-m)|^{k-1} = \begin{cases} c_{mk}, & n = m \\ 0 & \text{else} \end{cases} \qquad (35)$$

According to another embodiment, the magnitude of the first polynomial term of each delay tap may be monitored. Equation (35) profiles each tap value magnitude. The first term of every linear term of a tap is typically the largest, so a threshold may be selected by counting the number of taps before the coefficient magnitude drops below the point where the memory is assumed to be negligible, such as below 10 dB of the linear term. According to one embodiment, the memory depth for 40 dBm of output power may be up to seven delay taps. According to another embodiment, the memory depth for 45 dBm of output power may be up to twelve delay taps.

The value of the polynomial order P may be estimated by forward model module 52 performing a minimum least square fit of the PA baseband data y(n) to a model given by Equation (36):

$$e_{fwd} = \hat{y}(n) - x(n) \sum_{k=1}^{k=P} c_k |x(n)|^{k-1} \qquad (36)$$

An error function may be given by Equation (37):

$$e_{fwd} = y(n) - \hat{y}(n) = y(n) - x(n) \sum_{k=1}^{k=P} c_k |x(n)|^{k-1} \qquad (37)$$

A value of P such that $$\min_P |e_{fwd}|^2$$

may be determined.

Values of the forward model are substituted in Equation (37) as described by Equation (38):

$$e_{fwd} = x \left(\frac{1}{H_{IF\_RF}}\right) (G_{IF} H_{IF\_RF})(G_{PA} H_{PA})(G_{fb}) - x H_{fwd} = 0 \qquad (38)$$

to yield Equation (39):

$$(G_{IF})(G_{PA} H_{PA})(G_{fb}) = H_{fwd} \qquad (39)$$

By adjusting the total feedback gain to be equal to the combined forward path gain, which is described by Equation (40):

$$G_{fb} = \frac{1}{G_{IF} G_{PA}}$$

the forward model converges to an estimate of the PA forward path given by Equation (41):

$$H_{PA} = H_{fwd} \qquad (41)$$

which takes a forward non-linear polynomial function. The function may be given by Equation (42):

$$\frac{\hat{y}}{x} = \sum_{k=1}^{k=P} c_k |x|^{k-1} = c_1 + c_2 |x| + c_3 |x|^2 + c_4 |x|^3 + \ldots \qquad (42)$$

The coefficients $\{c_k\}$ may be estimated using least square fitting of samples of input x(n) and output y(n). These coefficients are passed to system monitor 24 which uses the coefficients to provide the monitor controller with power amplifier parameters such as signal gain, input third order intercept point (IIP3), and one-dB input power values ($P_{in, 1dB}$). The IIP3 is given by $$20 \log_{10}\left(\frac{c_1}{c_3}\right),$$

while the $P_{in,1dB}$ (dBm) is approximated by $P_{in,1dB}=\text{IIP3}-9.63\ 1\ \text{dB}$ [dBm].

Now that the PA is characterized in terms of P using Equation (33), the memory depth may be estimated next using off-line forward path model 52. Off-line forward model module 52 is programmed with the memory polynomial given by Equation (43):

$$\hat{y}(n) = \sum_{m=0}^{m=M} x(n-m) \sum_{k=1}^{k=P} c_{mk} |x(n-m)|^{k-1} \quad (43)$$

The values of the coefficients $c_{mk}$ are given by Equation (44):

$$\{c_{00}, c_{01}, c_{02}, c_{0k}, c_{03}, c_{04}, c_{05}, \ldots c_{0P,}\}, \quad (44)$$

for the first tap operating over $x(n)$, $$\{c_{10}, c_{11}, c_{12}, c_{1k}, c_{13}, c_{14}, c_{15}, \ldots c_{1P,}\},$$

for the second tap operating over $x(n-1)$, $$\vdots$$

$$\{c_{M0}, c_{M1}, c_{M2}, c_{Mk}, c_{M3}, c_{M4}, c_{M5}, \ldots c_{MP,}\},$$

for the last tap operating over $x(n-M)$.

To estimate the number of delays, or the value of M in Equation (43), the number of taps spaced at a single sample or sparsely spaced are varied while the error signal $|e_{inv}(n)|=|y(n)-\hat{y}(n)|$ is monitored. The tap delay at which the error is minimized is taken as the memory delay. The memory delay is passed from off-line model module 52 to inverse model module 54, which is also used to configure on-line pre-distorter 32 that is a replica of module 54. Alternatively, the number of taps M may be varied until the total tap power is 10 dB below the magnitude of the first tap, which is the linear term of each tap.

Step 214: Estimating and Reducing PA Non-Linearity Effects

Using off-line model module 54, the PA non-linearity may be estimated and reduced by passing the off-line estimated pre-distorter coefficients to on-line pre-distorter 32, which is a copy of the off-line inverse model. The power amplifier non-linearity effects are reduced in accordance with the memory depth M at step 214. The non-linearity effects may be reduced by estimating the non-linearity of power amplifier 40, determining pre-distortion weights to compensate for the non-linearity in accordance with the memory depth, and applying the pre-distortion weights. Inverse model module 54 may use any suitable technique to generate the pre-distorter weights applied to 32. For example, indirect learning may be used to train the off-line model module using the least means squares (LMS) or the recursive least squares (RLS) error minimization techniques.

According to the recursive least squares minimization technique, estimated signal $\hat{x}_{PD}(n)$ may be given by Equation (45):

$$\hat{x}_{PD}(n)=\hat{w}^H(n-1)y(n) \quad (45)$$

The inverse modeling error signal $e_{inv}(n)$ measures the difference between the pre-distorted signal $x_{PD}(n)$ and estimated signal $\hat{x}_{PD}(n)$, and may be given by Equation (46):

$$e_{inv}(n)=x_{PD}(n)-\hat{x}_{PD}(n) \quad (46)$$

The weights $\hat{w}(n)$ of the off-line processor may be iteratively generated from error signal $e_{inv}(n)$ according to Equation (47):

$$\hat{w}(n)=\hat{w}(n-1)+K(n)e_{inv}^*(n) \quad (47)$$

where $K(n)$ represents the Kalman gain given by Equation (48):

$$K(n) = \frac{\lambda^{-1}P(n-1)x_{PD}(n)}{1+\lambda^{-1}x_{PD}^H(n)P(n-1)x_{PD}(n)} \quad (48)$$

where $P(n)$ represents the inverse correlation matrix given by Equation (49):

$$P(n)=P(n-1)(I\lambda^{-1}-\lambda^{-1}K(n)x_{PD}^H(n)) \quad (49)$$

and where constant $\lambda$ represents the RLS forgetting factor, $0.95 \leq \lambda \leq 1$, and I represents the identity matrix. The initialization of the weights and the inverse correlation matrix may be set by $\hat{w}(0)=0$ and $P(0)=I\delta$, where $\delta$ is a constant ranging from 10 to 100.

Filter smoother 172 performs a smoothing operation on the weights, Pre-distorter 32 applies the weights to the input signal $x(n)$ to reduce the effects of non-linearity on output signal $y(t)$.

Step 218: Monitoring Performance

The performance of power amplifier 40 is monitored at step 218. System monitor 24 may be used to remotely and continuously monitor the dynamic performance of power amplifier 40 with information supplied from inverse and forward model modules 52 and 54. System monitor 24 may display statistical performance characteristics using any suitable graphical representation, for example, a graph or a bar chart.

According to one embodiment, system monitor 24 receives input signal $x(n)$, pre-distorted signal $x_{PD}(n)$, and output signal $y(n)$. The PA baseband input/output before linearization is given by Equation (50):

$$\frac{y(n)}{x(n)} = \frac{G_{PD}G_{IF}G_{PA}H_{PA}}{G_{fb}} \quad (50)$$

which represents the PA final AM/AM and AM/PM after linearization. The pre-distorter linear gain $G_{PD}$ is equal to the initial forward gain setting that is equal to $a_{01}$.

The PA baseband input/output after linearization is given by Equation (51):

$$\frac{y(n)}{x(n)} = \frac{G_{PD}H_{PD}G_{IF}G_{PA}H_{PA}}{G_{fb}} \quad (51)$$

where the on-line pre-distorter 32 is programmed to be a replica of the inverse transfer function of power amplifier 40

$$H_{PD} = \frac{1}{H_{PA}},$$

and the baseband input/output after linearization is given by $$\frac{y(n)}{x(n)} = \frac{G_{PD}G_{IF}G_{PA}}{G_{fb}}.$$

The pre-distorter forward transfer function, that is the pre-distorter AM/AM and AM/PM, is given by Equation (52):

$$\frac{x(n)}{x_{PD}(n)} = G_{PD}H_{PD} \quad (52)$$

where $G_{PA}$ represents the PA gain, $G_{IF}$ represents the gain from the baseband to radio frequency conversion, and $G_{fb}$ represents the total feedback gain that includes gain from the conversion from the PA output coupler to the input of inverse model module 54. The shape of the pre-distorter transfer function $$\frac{x(n)}{x_{PD}(n)}$$

should be the inverse in shape and sign to the PA transfer function $$\frac{y(n)}{x_{PD}(n)} = \frac{G_{IF}G_{PA}H_{PA}}{G_{fb}}.$$

System monitor 24 can supply the shape of these transfer functions to indicate the progress and effectiveness of the PA linearization.

According to one embodiment, the PA gain variation may be determined from signals x(n) and y(n) and estimated linear term $x(n)a_{01}$ generated by forward model module 52. The gain variation may be displayed in continuous time or in blocks of time. In addition, the average output power of power amplifier 40 and the peak-to-average power ratio may be estimated. For example, the normalized estimated average output power $\hat{P}_{avg}$ may be defined by Equation (53):

$$\hat{P}_{avg} = \frac{1}{N}\sum_{n=1}^{N}\left|\frac{y(n)}{G_{fb}}\right|^2 \quad (53)$$

As another example, the average output power may be estimated from the Raleigh distribution of the magnitude of the output baseband samples of signal y(n), where the probability distribution may be given by Equation (54):

$$f(r)_y \frac{r}{\sigma_y^2} e^{-\frac{r^2}{2\sigma_y^2}} \quad (54)$$

where r=|y(n)| and $$\sigma = \sqrt{\frac{\hat{P}_{avg}}{2}}.$$

As another example, the output peak power can be estimated from blocks of consecutive buffers of samples of signal y(n).

System monitor 24 may also be used to monitor linearization of power amplifier 40 from the shape of the pre-distorter transfer function $$\frac{x_{PD}(n)}{x(n)} = G_{PD}H_{PD} = G_{PD}H_{\text{off\_i}} = G_{PD}\frac{1}{H_{PA}},$$

and the PA transfer functions before linearization is given by Equation (55):

$$\frac{y(n)}{x(n)} = \frac{G_{PD}G_{IF}G_{PA}}{G_{fb}} \quad (55)$$

After linearization, with $$H_{PD} = \frac{1}{H_{PA}},$$

the PA AM/AM and AM/FM, which is the forward complex transfer function, is given by $$\frac{y(n)}{x(n)} = \frac{G_{PD}H_{PD}G_{IF}G_{PA}}{G_{fb}}.$$

According to one embodiment, initial samples of signals x(n), $x_{PD}(n)$, and y(n) may be collected to generate and display the inverse and forward AM/AM and AM/PM. System monitor 24 may be used to check whether the estimated inverse $$\text{AM/AM } \left|\frac{x_{PD}(n)}{x(n)}\right|$$

is sufficiently close to inverse of the PA AM/AM given by $$\left|\frac{y(n)}{x_{PD}(n)}\right|$$

and that the phase of the pre-distorter transfer function is the opposite (conjugate) of the PA transfer function as expressed by Equation (56):

$$\tan^{-1}\left(\frac{x_{PD}(n)}{x_{PD}(n)}\right) \tag{56}$$

Alterations or permutations such as modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that off-line components for determining non-linearity of on-line components may be located remote from the on-line components. Locating the off-line components remote from the on-line components may allow for remote linearization of the on-line components while reducing power and space requirements for the on-line components.

While this disclosure has been described in terms of certain embodiments and generally associated methods, alterations and permutations of the embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for estimating non-linearity of a power amplifier, comprising:
   receiving a plurality of signals at a first location, the plurality of signals comprising an input signal, a pre-distorted signal, and an output signal, the input signal being pre-distorted to yield the pre-distorted signal, the pre-distorted signal being amplified by a power amplifier to yield the output signal, the output signal exhibiting distortion with respect to the input signal, the distortion comprising a non-linearity effect, the power amplifier located at a second location remote from the first location;
   estimating non-linearity of the power amplifier in accordance with the signals at the first location using an inverse model;
   calculating pre-distortion information according to the estimated non-linearity using the inverse model; and
   sending the pre-distortion information to a pre-distorter at the second location, the pre-distorter operable to reduce the non-linearity effect using the pre-distortion information.

2. The method of claim 1, further comprising reducing an impairment effect of the distortion by:
   isolating the impairment effect of the distortion using the inverse model; and
   calculating compensation information according to the isolated impairment effect; and
   sending the compensation information to an impairment compensator at the second location, the impairment compensator operable to reduce the impairment effect using the compensation information.

3. The method of claim 1, wherein estimating the non-linearity of the power amplifier further comprises:
   estimating a memory depth of the power amplifier at the first location using a forward model located at the second location to generate memory information; and
   estimating at the second location the non-linearity of the power amplifier in accordance with the memory information.

4. The method of claim 3, wherein estimating the memory depth of the power amplifier using further comprises:
   establishing an output signal polynomial corresponding to the output signal;
   establishing a polynomial order of the output signal polynomial to fit the distortion; and
   determining a number of delay taps to be implemented at the pre-distorter using the output signal polynomial with the established polynomial order.

5. The method of claim 3, wherein estimating the memory depth of the power amplifier further comprises:
   establishing an output signal polynomial corresponding to the output signal, the output signal polynomial comprising a plurality of coefficients;
   varying a number of delay taps of the power amplifier;
   monitoring the plurality of coefficients in response to the variation with respect to a memory threshold;
   determining that the plurality of coefficients fall below the memory threshold with a certain number of delay taps; and
   identifying the certain number of delay taps as a number of delay taps for modeling the power amplifier.

6. The method of claim 1, further comprising:
   calculating a performance characteristic from the signals, the performance characteristic describing performance of the power amplifier; and
   displaying a graphical representation of the performance characteristic using a system monitor at the first location.

7. The method of claim 1, wherein the first location is more than one yard from the second location.

8. The method of claim 1, wherein the first location is more than one mile from the second location.

9. The method of claim 1, wherein the first location is more than one hundred miles from the second location.

10. A system for estimating non-linearity of a power amplifier, comprising:
    an inverse model module at a first location operable to:
        receive a plurality of signals, the plurality of signals comprising an input signal, a pre-distorted signal, and an output signal, the input signal being pre-distorted to yield the pre-distorted signal, the pre-distorted signal being amplified by a power amplifier to yield the output signal, the output signal exhibiting distortion with respect to the input signal, the distortion comprising a non-linearity effect, the power amplifier located at a second location remote from the first location;
        estimate non-linearity of the power amplifier in accordance with the signals; and
        calculate pre-distortion information according to the estimated non-linearity; and a transmitter coupled to the inverse model module and operable to send the pre-distortion information to a pre-distorter at the second location, the pre-distorter operable to reduce the non-linearity effect using the pre-distortion information.

11. The system of claim 10, wherein:
the inverse model module is further operable to reduce an impairment effect of the distortion by:
 isolating the impairment effect of the distortion; and
 calculating compensation information according to the isolated impairment effect; and
the transmitter is further operable to send the compensation information to an impairment compensator at the second location, the impairment compensator operable to reduce the impairment effect using the compensation information.

12. The system of claim 10, further comprising a forward model module located at the second location and operable to estimate a memory depth of the power amplifier to generate memory information, the inverse model module being operable to estimate the non-linearity of the power amplifier in accordance with the memory information.

13. The system of claim 12, wherein forward model module is further operable to estimate the memory depth of the power amplifier by:
 establishing an output signal polynomial corresponding to the output signal;
 establishing a polynomial order of the output signal polynomial to fit the distortion; and
 determining a number of delay taps to be implemented at the pre-distorter using the output signal polynomial with the established polynomial order.

14. The system of claim 12, wherein forward model module is further operable to estimate the memory depth of the power amplifier by:
 establishing an output signal polynomial corresponding to the output signal, the output signal polynomial comprising a plurality of coefficients;
 varying a number of delay taps of the power amplifier;
 monitoring the plurality of coefficients in response to the variation with respect to a memory threshold;
 determining that the plurality of coefficients fall below the memory threshold with a certain number of delay taps; and
 identifying the certain number of delay taps as a number of delay taps for modeling the power amplifier.

15. The system of claim 10, further comprising a system monitor at the first location operable to:
 calculate a performance characteristic from the signals, the performance characteristic describing performance of the power amplifier; and
 display a graphical representation of the performance characteristic.

16. The system of claim 10, wherein the first location is more than one yard from the second location.

17. The system of claim 10, wherein the first location is more than one mile from the second location.

18. The system of claim 10, wherein the first location is more than one hundred miles from the second location.

19. A system for estimating non-linearity of a power amplifier, comprising:
 means for receiving a plurality of signals at a first location, the plurality of signals comprising an input signal, a pre-distorted signal, and an output signal, the input signal being pre-distorted to yield the pre-distorted signal, the pre-distorted signal being amplified by a power amplifier to yield the output signal, the output signal exhibiting distortion with respect to the input signal, the distortion comprising a non-linearity effect, the power amplifier located at a second location remote from the first location;
 means for estimating non-linearity of the power amplifier in accordance with the signals at the first location using an inverse model;
 means for calculating pre-distortion information according to the estimated non-linearity using the inverse model; and
 means for sending the pre-distortion information to a pre-distorter at the second location, the pre-distorter operable to reduce the non-linearity effect using the pre-distortion information.

20. A method for estimating non-linearity of a power amplifier, comprising:
 receiving a plurality of signals at a first location, the plurality of signals comprising an input signal, a pre-distorted signal, and an output signal, the input signal being pre-distorted to yield the pre-distorted signal, the pre-distorted signal being amplified by a power amplifier to yield the output signal, the output signal exhibiting distortion with respect to the input signal, the distortion comprising a non-linearity effect, the power amplifier located at a second location remote from the first location, the first location being more than one hundred miles from the second location;
 reducing an impairment effect of the distortion by:
  isolating the impairment effect of the distortion using an inverse model at the first location; and
  calculating compensation information according to the isolated impairment effect; and
  sending the compensation information to an impairment compensator at the second location, the impairment compensator operable to reduce the impairment effect using the compensation information;
 estimating at the second location non-linearity of the power amplifier in accordance with the signals at the first location using the inverse model, the non-linearity estimated by:
  estimating a memory depth of the power amplifier at the first location using a forward model located at the second location to generate memory information; and
  estimating the non-linearity of the power amplifier in accordance with the memory information by:
   establishing an output signal polynomial corresponding to the output signal;
   establishing a polynomial order of the output signal polynomial to fit the distortion; and
   determining a number of delay taps to be implemented at the pre-distorter using the output signal polynomial with the established polynomial order by:
    establishing an output signal polynomial corresponding to the output signal, the output signal polynomial comprising a plurality of coefficients;
    varying a number of delay taps of the power amplifier;
    monitoring the plurality of coefficients in response to the variation with respect to a memory threshold;
    determining that the plurality of coefficients fall below the memory threshold with a certain number of delay taps; and identifying the certain number of delay taps as a number of delay taps for modeling the power amplifier;
calculating pre-distortion information according to the estimated non-linearity using the inverse model; and
sending the pre-distortion information to a pre-distorter at the second location, the pre-distorter operable to reduce the non-linearity effect using the pre-distortion information;

calculating a performance characteristic from the signals, the performance characteristic describing performance of the power amplifier; and
displaying a graphical representation of the performance characteristic using a system monitor at the first location.

* * * * *